US006830391B2

(12) United States Patent
Clayvon et al.

(10) Patent No.: US 6,830,391 B2
(45) Date of Patent: Dec. 14, 2004

(54) MEDIA CARTRIDGE WITH PRINTED CIRCUIT BOARD FOR USE IN A PRINTING SYSTEM

(75) Inventors: Anthony E. Clayvon, Stone Mountain, GA (US); James J. McElligott, Alpharetta, GA (US)

(73) Assignee: Panduit Corp., Tinley Park, IL (US)

( * ) Notice: Subject to any disclaimer, the term of this patent is extended or adjusted under 35 U.S.C. 154(b) by 0 days.

(21) Appl. No.: 09/957,987

(22) Filed: Sep. 21, 2001

(65) Prior Publication Data

US 2003/0059246 A1 Mar. 27, 2003

(51) Int. Cl.[7] .................................................. B41J 3/36
(52) U.S. Cl. ............................ 400/88; 400/207; 347/19
(58) Field of Search .......................... 400/88, 76, 207, 400/208, 613, 718; 347/19, 50, 86; 439/67, 955; 327/525; 399/12, 13

(56) References Cited

U.S. PATENT DOCUMENTS

| 3,134,254 | A | | 5/1964 | Richard ........................ 70/277 |
| 3,392,558 | A | | 7/1968 | Hedin et al. .................. 361/172 |
| 3,930,304 | A | | 1/1976 | Keller et al. ................... 438/6 |
| 4,437,229 | A | | 3/1984 | Bitler et al. ................... 29/593 |
| 4,706,096 | A | | 11/1987 | Sato ............................ 347/218 |
| 4,797,018 | A | * | 1/1989 | Hofmann et al. ........... 400/249 |
| 4,820,064 | A | | 4/1989 | Sato et al. ............. 400/120.16 |
| 5,015,324 | A | | 5/1991 | Goodwin et al. ........... 156/384 |
| 5,024,541 | A | | 6/1991 | Tsukada et al. .............. 400/88 |
| 5,051,009 | A | | 9/1991 | Sugiura et al. ........ 400/120.16 |
| 5,056,940 | A | | 10/1991 | Basile ...................... 400/235.1 |
| 5,078,523 | A | | 1/1992 | McGourty et al. .......... 400/613 |
| 5,237,487 | A | | 8/1993 | Dittmer et al. ............. 361/683 |
| 5,318,370 | A | | 6/1994 | Nehowig ..................... 400/613 |
| 5,352,049 | A | | 10/1994 | Shiraishi et al. ............ 400/208 |
| 5,358,798 | A | | 10/1994 | Kleinert, III et al. ........... 429/7 |
| 5,363,134 | A | * | 11/1994 | Barbehenn et al. ........... 347/49 |
| 5,411,339 | A | | 5/1995 | Bahrabadi et al. ............ 400/56 |
| 5,421,745 | A | | 6/1995 | Aksoy et al. ................ 439/626 |
| 5,435,657 | A | | 7/1995 | Pearce et al. ................ 400/208 |
| D361,342 | S | | 8/1995 | Hattori et al. ................ D18/56 |
| 5,471,163 | A | * | 11/1995 | Childers ...................... 327/525 |
| 5,472,804 | A | | 12/1995 | Austin et al. .................. 429/99 |
| 5,504,507 | A | | 4/1996 | Watrobski et al. ............ 347/19 |
| 5,533,818 | A | | 7/1996 | Bahrabadi ................... 400/208 |
| D373,791 | S | | 9/1996 | Nobata ........................ D18/56 |
| D376,796 | S | | 12/1996 | Hirasawa ..................... D14/21 |
| 5,587,250 | A | | 12/1996 | Thomas et al. ................. 429/3 |
| 5,618,119 | A | | 4/1997 | Misu et al. .................. 400/208 |
| 5,645,360 | A | | 7/1997 | Iwane et al. ................. 400/613 |
| 5,670,266 | A | | 9/1997 | Thomas et al. ................. 429/3 |
| 5,699,091 | A | * | 12/1997 | Bullock et al. ............... 349/19 |
| 5,709,486 | A | | 1/1998 | Day ........................... 400/208 |
| 5,740,066 | A | | 4/1998 | Suppelsa et al. ............... 716/1 |
| 5,800,937 | A | | 9/1998 | Decker et al. .................. 429/7 |

(List continued on next page.)

FOREIGN PATENT DOCUMENTS

| EP | 927639 A2 | 7/1999 | |
| EP | 1053885 A1 | 11/2000 | |
| JP | 63298869 A | * 12/1988 | .......... G11B/20/10 |
| JP | 06008194 A | * 1/1994 | .......... B26D/5/08 |

*Primary Examiner*—Minh Chau
(74) *Attorney, Agent, or Firm*—Robert A. McCann; Christopher S. Clancy

(57) ABSTRACT

A printing system includes a printing machine and media cartridge. The printing machine has a housing, a printing mechanism and a processing unit connected to the housing, a media cartridge interface connecting the media cartridge to the printing machine, and a look-up table for storing media cartridge parameters. The media cartridge has a media support for a media source, and a printed circuit board. The printed circuit has a plurality of conductive traces with fusible links connected together in a circuit pattern on at least one of its sides. The circuit pattern includes an encoding of at least one media cartridge parameter that may be stored in the look-up table of the printing machine.

15 Claims, 10 Drawing Sheets

U.S. PATENT DOCUMENTS

| | | | |
|---|---|---|---|
| 5,823,689 A | 10/1998 | Nehowig et al. | 400/83 |
| 5,896,080 A | 4/1999 | Chen | 337/407 |
| 5,918,989 A * | 7/1999 | Stout et al. | 400/88 |
| 5,951,177 A | 9/1999 | Schanke et al. | 400/218 |
| 5,964,539 A | 10/1999 | Yamaguchi et al. | 400/120.16 |
| 6,042,280 A | 3/2000 | Yamaguchi et al. | 400/120.16 |
| 6,116,796 A | 9/2000 | Yamaguchi et al. | 400/615.2 |
| 6,132,120 A | 10/2000 | Yamaguchi et al. | 400/615.2 |
| 6,161,915 A * | 12/2000 | Bolash et al. | 349/19 |
| 6,325,483 B1 * | 12/2001 | Harbour et al. | 347/19 |

* cited by examiner

| Index | Media Type Number | Serial Number | Starting Media Amount | Remaining Media Amount |
|---|---|---|---|---|
| 1 | 2 | 524 | 100 | 23 |
| 2 | 5 | 24056 | 100 | 56 |
| 3 | 10 | 10 | 250 | 124 |
| 4 | 124 | 5219 | 500 | 249 |
| 5 | 5 | 310 | 250 | 108 |
| 6 | 10 | 3424 | 100 | 15 |
| 7 | 2 | 10025 | 100 | 8 |

FIG. 9

MEDIA CARTRIDGE WITH PRINTED CIRCUIT BOARD FOR USE IN A PRINTING SYSTEM

RELATED APPLICATION

This disclosure is related to the following U.S. patent application filed on the same date as this application, owned by the assignee of this application, and the entirety of which is hereby incorporated herein by reference.

U.S. patent application entitled "Thermal Printed Mechanism", naming Gregory C. Yehl and Michael Scott Adams as inventors.

1. Field of the Invention

This invention pertains to the field of printing systems. More specifically, this invention pertains to the field of media cartridges for printers, such as label roll printers.

2. Background of the Invention

Label roll printers are utilized in order to create customized labels for home or office purposes. Thus, the growing demand for customized labels in recent years has increased the use of these printers. Typically, label roll printer systems have been comprised of a media cartridge and a printing machine. The media cartridge may contain a media source, such as a roll of labels, and some sort of a media support assembly. The printing machine is often comprised of a housing, a processing unit with an operating system, and a printing mechanism.

There have been some enhancements made in the prior art on this standard printer design. Prior art designs of media cartridges have included memory chips with custom interfacing contacts, and an electronic connection to their printing machines. The memory chips contain data about the type of media source that is contained within their media cartridges, and this data is sent electronically to the corresponding printing machines. The printing systems of the prior art that use such memory chips, however, have several drawbacks. First, the cost of such memory chips is often very high, greatly increasing the price of their corresponding media cartridges. Also, memory chips are often susceptible to electrostatic discharge. Thus, other appliances near the printers that create electrostatic discharge, or common everyday static electricity, may permanently damage the memory chips and render them useless. In addition, the use of solder joints in many memory chips also makes them susceptible to failure due to faulty solder connections.

Instead of memory chips, other prior art printer system designs have used features that activate mechanical switches on their media cartridges to encode the types of media sources that are used. These prior art media cartridges using mechanical switches are also plagued by a variety of problems. First, mechanical switches are often very expensive and require custom fittings and housings. Therefore, the use of mechanical switches may significantly increase the cost of the printing system, and make it less appealing to consumers. Second, as products age, their mechanical moving parts are often susceptible to failure due to wear and tear. Thus, the mechanical switches utilized with these media cartridges are likely to fail as time passes. Finally, prior art designs have only been able to utilize a few mechanical switches per media cartridge. Since the amount of data mechanical switches can encode is proportional to the number of switches present, these media cartridge designs can only encode a very limited amount of data. Therefore, the mechanical switches may only enable the printing machine to distinguish between a few media types.

Another disadvantage common to most of the prior art printing systems is that their printing machines are unable to recognize individual media cartridges. In other words, although these prior art printing systems enable their printing machines to recognize a number of different types of media cartridges as explained above, most do not create an individual identification parameter, such as a serial number, for identifying each media cartridge regardless of its media type.

Accordingly, it is desirable to have a media cartridge (e.g., label roll) for printing systems (e.g., label roll printers) that overcomes the above deficiencies associated with the prior art.

SUMMARY OF THE INVENTION

The present invention is a printing system comprising of a media cartridge and a printing machine. The media cartridge is preferably comprised of a media source and a printed circuit board having a plurality of conductive traces with fusible links that form a circuit pattern. The fusible links encode information about the media cartridge. The fusible links may encode a media type number that contains information about the type of media source used in the media cartridge. In addition, or alternatively, the fusible links may encode a serial number specific to the media cartridge that enables it to be individually identified by the printing machine.

The printing machine is preferably comprised of a housing, a processing unit and a printing mechanism connected to the housing, a media cartridge interface connecting the printing machine to the media cartridge, and a look-up table. The look-up table may be comprised of the media type number for each media cartridge that has been attached to the printing machine. In addition, or alternatively, the look-up table may be comprised of the individual serial numbers for each of these media cartridges. The look-up table may also keep track of the amount of media used within individual media cartridges. Also, the look-up table may keep track of user settings associated with an individual media cartridge.

BRIEF DESCRIPTION OF DRAWINGS

FIG. 9 is a block diagram of an exemplary embodiment of a look-up table for use in the operation of the printing system of FIG. 1, as shown in FIG. 7.

DETAILED DESCRIPTION

Figure 1:
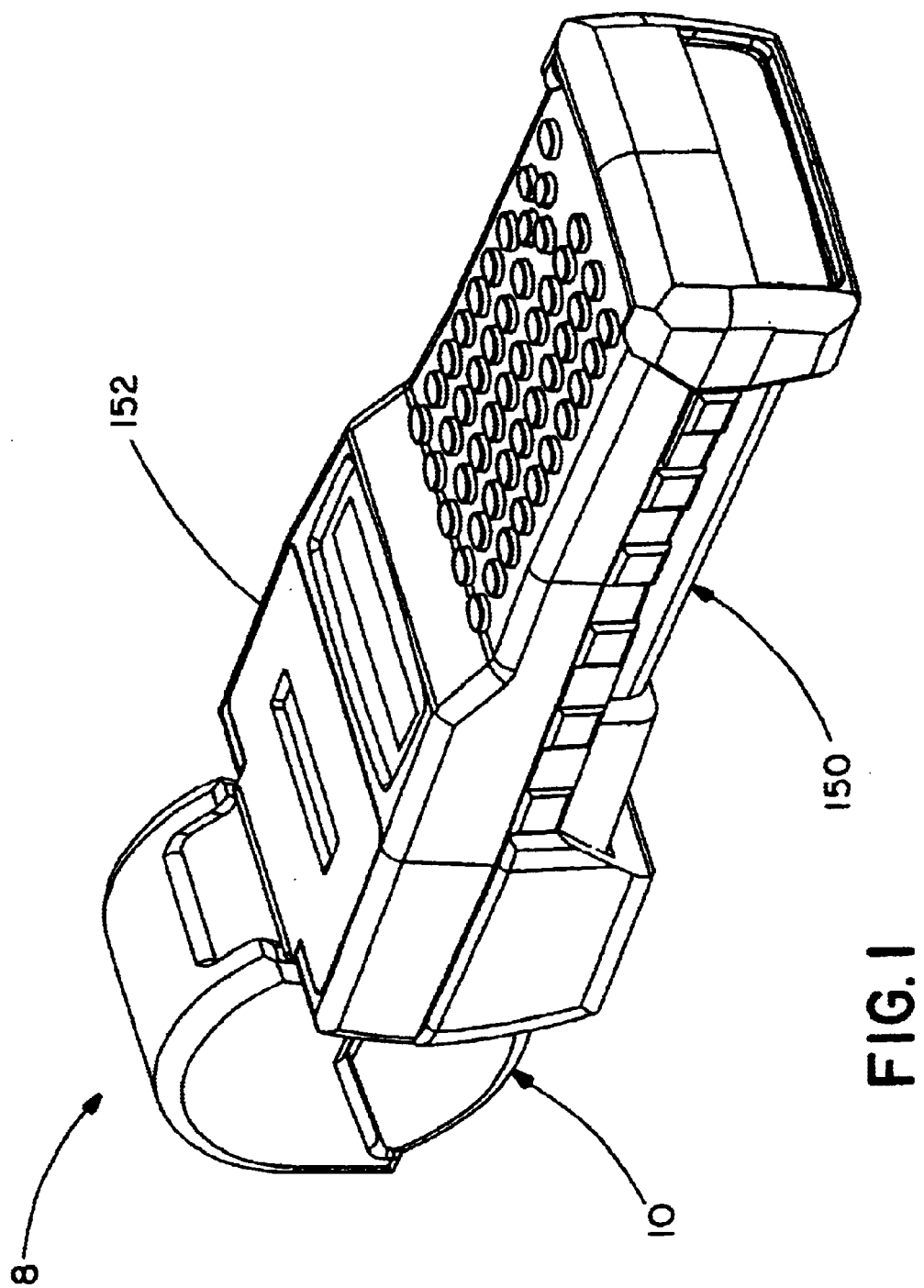
FIG. 1 is a perspective view of an exemplary embodiment of a printing system.

Turning now to the drawings, FIG. 1 shows an exemplary printing system 8 of the present invention. The printing system 8 preferably comprises a media cartridge 10 that is inserted into a housing 152 of a printing machine 150. While a label roll is shown in FIG. 1 as the media source for the media cartridge 10, it should be understood that any type of media source, including media sources other than label rolls (e.g., label sheets, photograph paper, etc.), may be used with the printing system of the present invention. Similarly, while a label roll printer is shown in FIG. 1 as the printing machine 150, it should also be understood that any type of printing machine, including printing machines other than label roll printers (e.g., laser printers, photograph printers, etc.), may be used with the printing system of the present invention.

Figure 2:
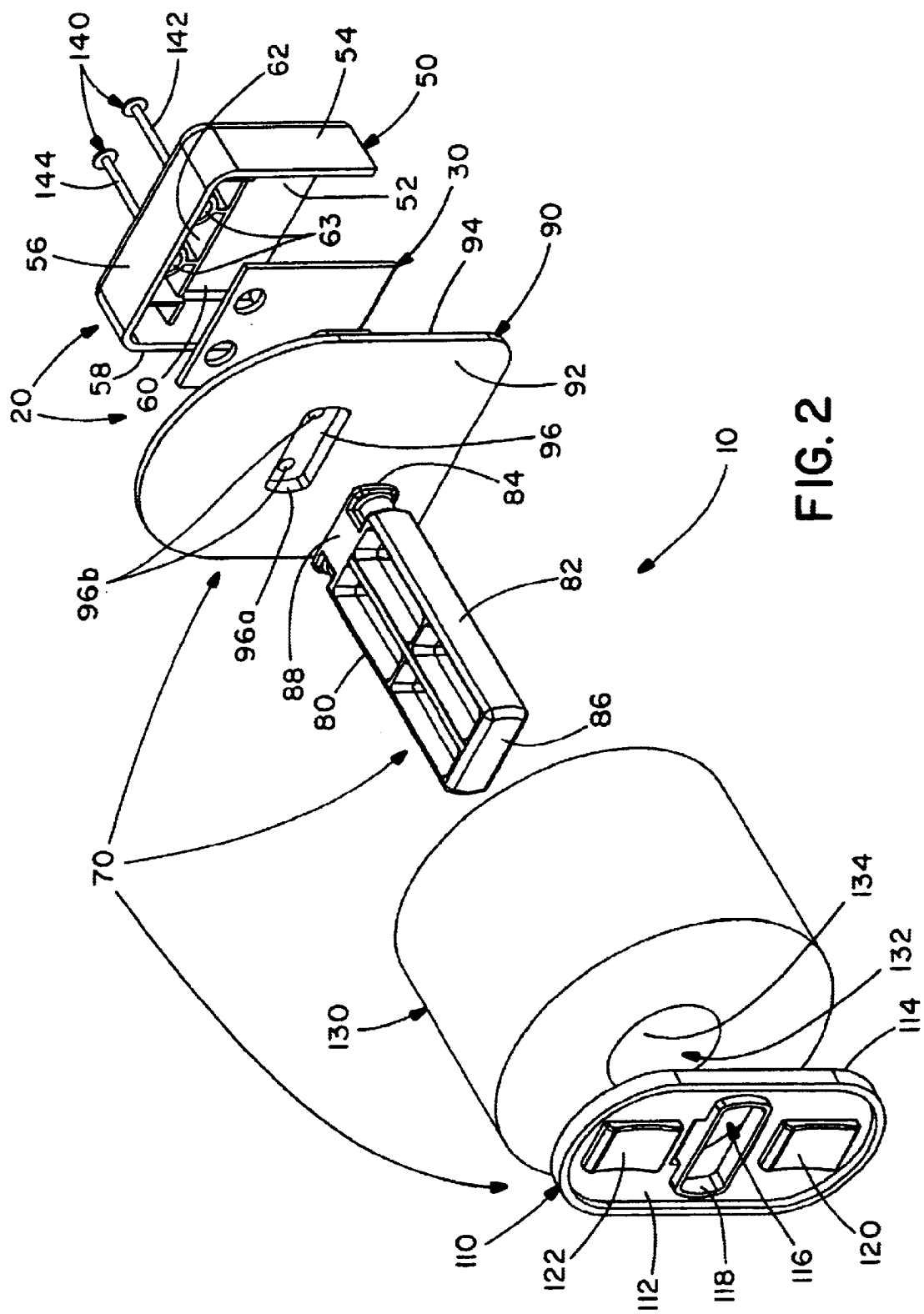
FIG. 2 is an exploded view of an exemplary embodiment of a media cartridge for use in the printing system of FIG. 1.

FIG. 2 illustrates an exploded view of an exemplary embodiment of the media cartridge 10. The media cartridge 10 comprises a printed circuit board assembly 20, a media support assembly 70, a media source 130, and a pair of fasteners 140. The printed circuit board assembly 20 comprises a printed circuit board 30 and a printed circuit board cover 50.

Figure 3:
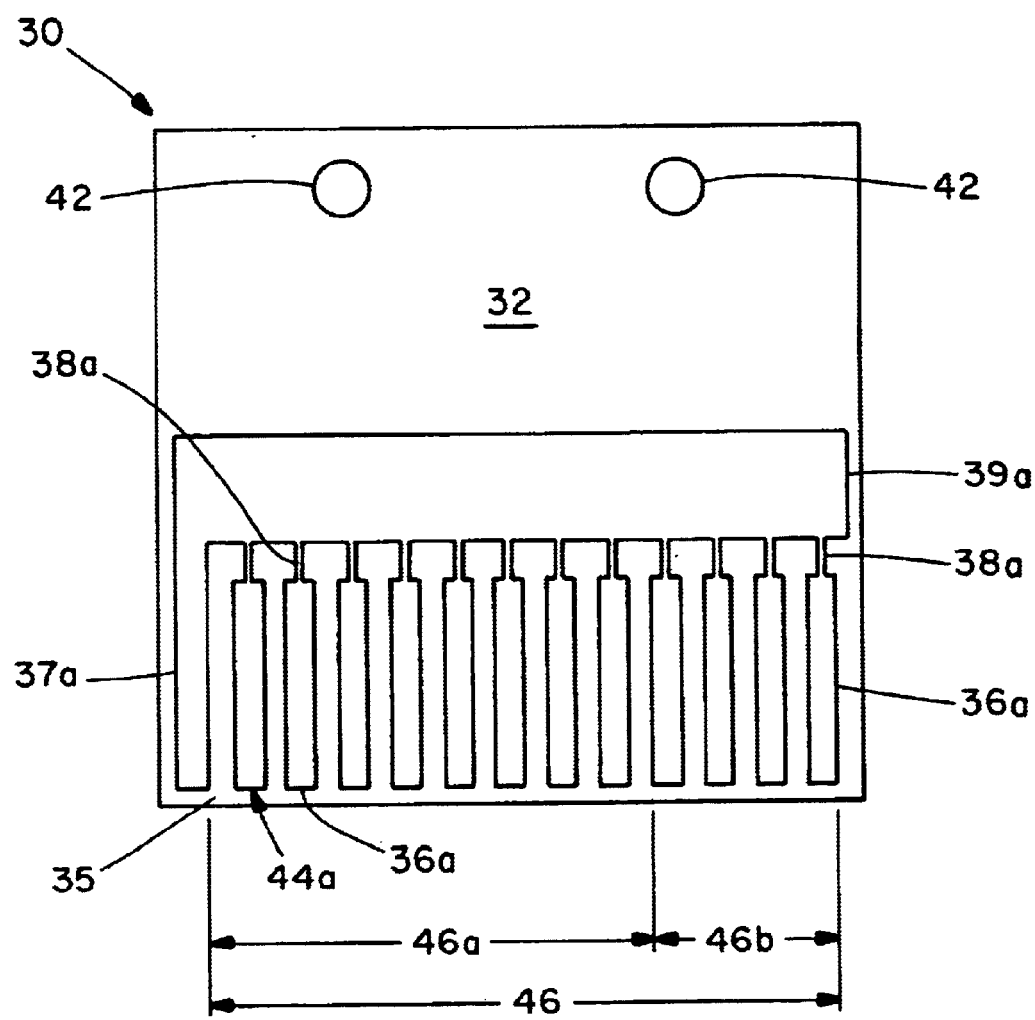
FIG. 3 is a side view of an exemplary embodiment of a printed circuit board for use in the media cartridge of FIG. 2.

FIG. 3 shows the exemplary embodiment of the printed circuit board 30 in greater detail. The printed circuit board 30 has a first side 32, a second side 34 (see FIG. 4), a connection edge 35, and a pair of fastener holes 42. The first side 32 of the printed circuit board 30 preferably has a plurality of conductive traces 36a with fusible links 38a that are connected together to form a circuit pattern 44a. It should be understood that while twelve conductive traces 36a are shown in the printed circuit board 30 of FIG. 3, more or less conductive traces 36a may be used with the printed circuit board of the present invention, depending on consumer and/or manufacturing preferences. As shown in FIG. 3, the fusible links 38a are also connected together by a common conductive trace 39a, which in turn is also connected to a common conductive trace 37a. Preferably, the plurality of conductive traces 36a and the common conductive trace 37a are all in communication with the connection edge 35 of the printed circuit board 30.

The circuit pattern 44a (and its plurality of conductive traces 36a and fusible links 38a) preferably has an encoding for one or more parameters 46 associated with the media cartridge 10 that includes the corresponding printed circuit board 30, as shown in FIG. 3. As discussed in more detail below, each conductive trace 36a of the circuit pattern 44a preferably represents a bit integer (i.e., 1 or 0), and the collection of conductive traces 36a represent a binary number, which in turn may be translated into a numerical value for the parameter 46. As shown in FIG. 3, the circuit pattern may include an encoding for a single parameter 46, or alternatively, may include an encoding for two or more parameters, such as a media type number 46a and a serial number 46b. In one exemplary embodiment of the present invention, the media type number 46a may be encoded via eight conductive traces 36a (i.e., an eight bit number) of the circuit pattern 44a, while the serial number 46b may be encoded via the remaining four conductive traces 36a (i.e., a four bit number) of the circuit pattern 44a. Of course, it should be understood that any combination of conductive traces 36a may be used to represent these parameters, and the present invention should not be limited to the exemplary embodiment shown and described in the present application. In other words, the media type number 46a and the serial number 46b may be comprised of any length bit number depending on the number of conductive traces used in the relative circuit pattern.

Preferably, the media type number 46a (or 46a') is used to describe the media source 130 used in the media cartridge 10. In the present exemplary embodiment, the media source 130 is comprised of a roll of labels, so the media type number 46a may encode a numerical value that identifies the type of label contained in the media source 130. Similarly, the serial number 46b (or 46b') is preferably used to identify a particular media cartridge 10 independent of its media type. In other words, such a serial number could make a specific media cartridge 10 individually recognizable to the printing machine 150. As a result, the printing machine is preferably capable of "remembering" a media cartridge and its characteristics (e.g., amount of labels remaining) even if it has been removed and later reinserted into the printing machine.

Figure 4A:
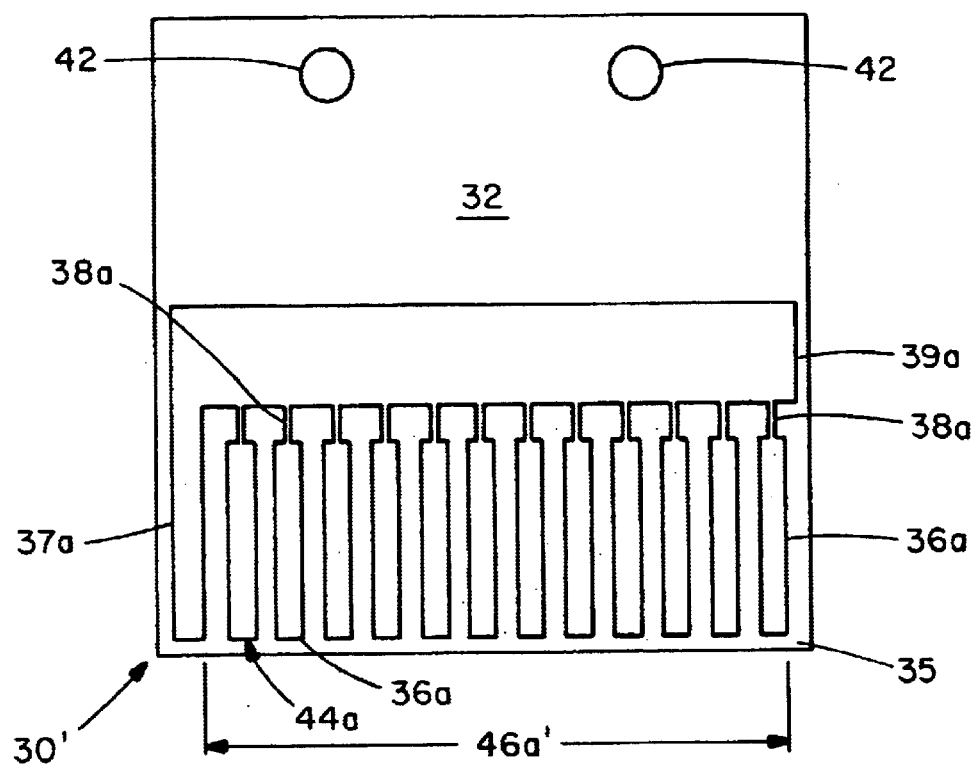
FIGS. 4a-4b are side views of another exemplary embodiment of a printed circuit board for use in the media cartridge of FIG. 2.
Figure 4B:
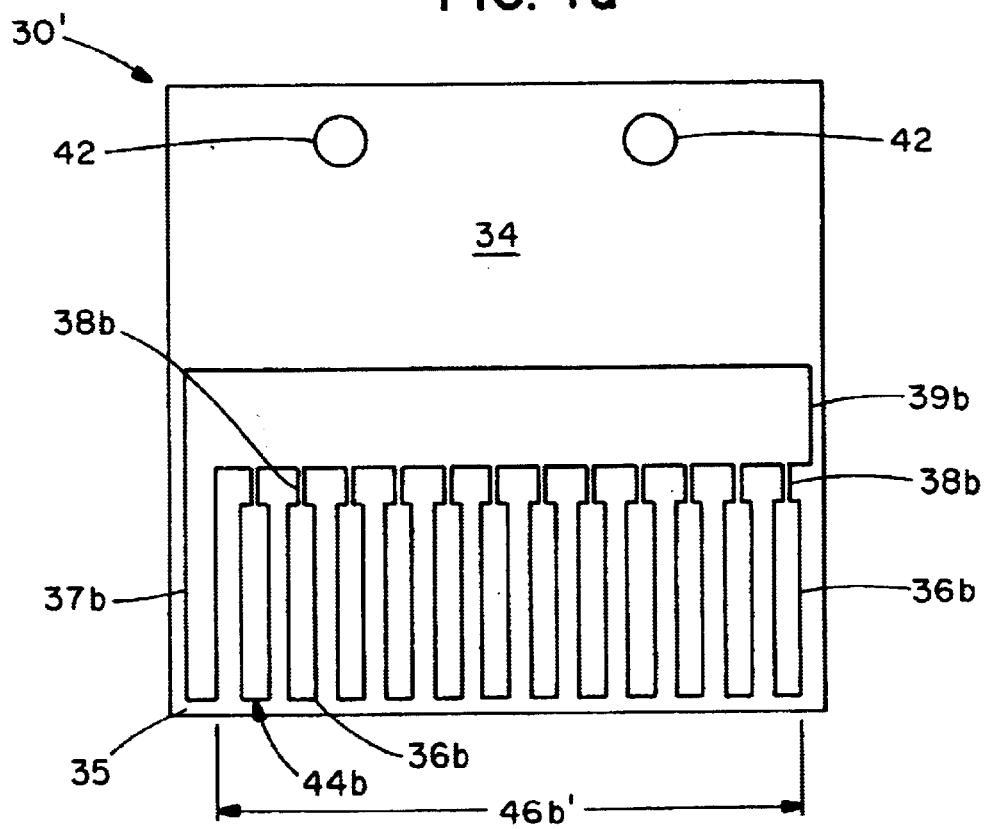

Another exemplary embodiment of a printed circuit board 30' for use with the media cartridge 10 of the present invention is shown in FIGS. 4a-4b. The printed circuit board 30' is identical to the printed circuit board 30 described above and shown in FIG. 3, except that both the first and second sides 32, 34 of the printed circuit board 30' have circuit patterns 44a, 44b, with the circuit patterns 44a, 44b of the printed circuit board 30' 30 both including an encoding for media cartridge parameters, such as a media type number 46a' and a serial number 46b'. Similarly, the second side 34 is preferably, but not necessarily, identical to the first side 32, except that its parameter 46b' may be used for different purpose (i.e., a serial number) than the parameter 46a' (i.e., a media type number). For ease of reference, corresponding components of the second side 34 have been referenced with a "b" in FIG. 4b, instead of the "a" used in FIG. 4a. As an example, the conductive traces 36a and the fusible links 38a of the first side 32 of the printed circuit board have been referenced as the conductive traces 36b and the fusible links 38b for the second side 34 of the printed circuit board. It should be understood that the "a" and "b" components in FIGS. 4a and 4b are preferably identical (except for the parameters 46a' and 46b') unless otherwise stated to the contrary herein.

As a result of this alternative exemplary embodiment, the circuit pattern 44a of the first side 32 of the printed circuit board 30' may include an encoding for a twelve bit media type number 46a', and the circuit pattern 44b of the second side 34 of the printed circuit board 30' may include an encoding for a twelve bit serial number 46b'. Once again, however, it should be understood that any combination of the circuit patterns 44a, 44b, or portions thereof, may be used to represent the parameters 46a', 46b' (and/or any other parameters).

Figure 5:
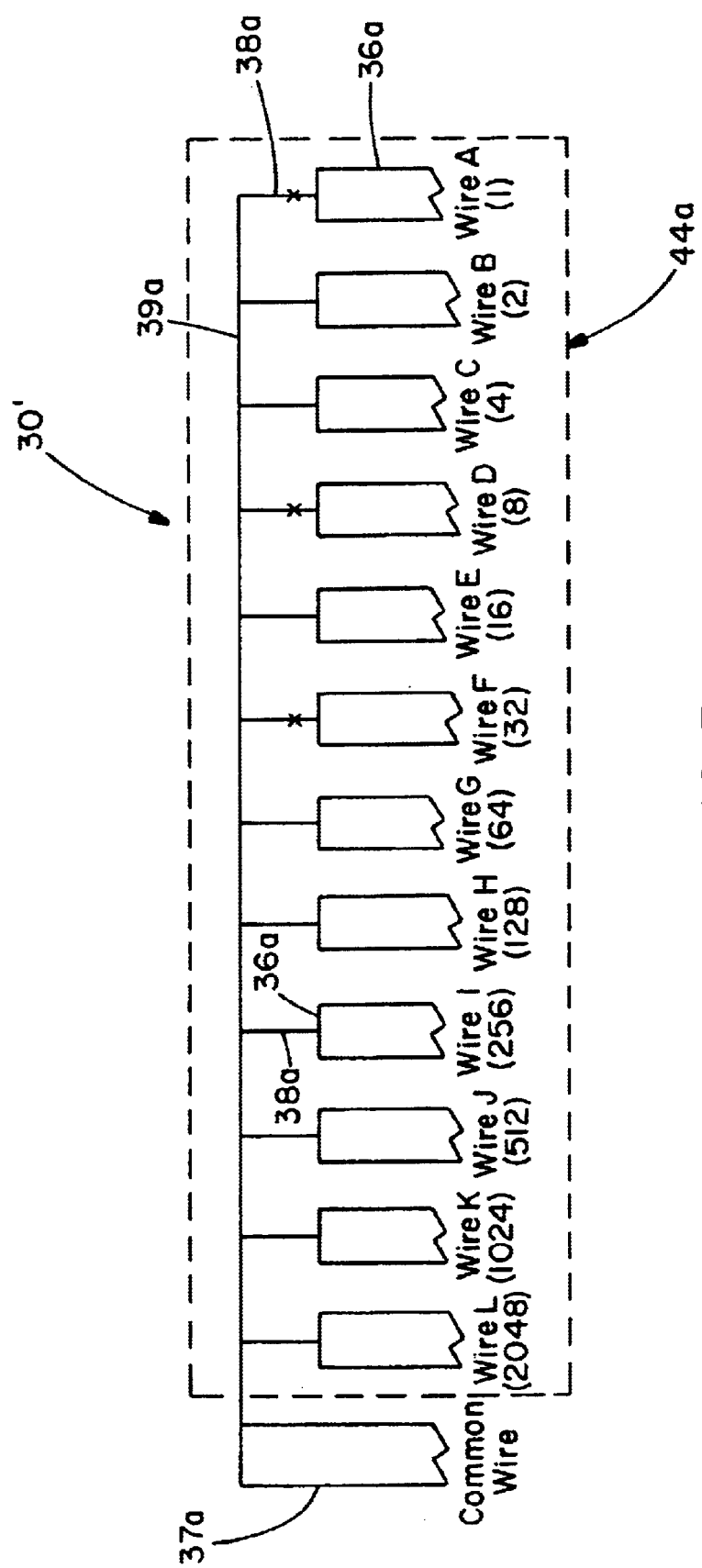
FIG. 5 is a side view of an exemplary embodiment of the details of the electrical interconnections of one possible circuit pattern.

FIG. 5 details the electrical interconnections of one possible circuit pattern for a printed circuit board of the present invention, regardless of which embodiment is employed for the printed circuit board. For exemplary purposes, however, only the circuit pattern 44a of FIG. 4a is shown in FIG. 5 and will described herein. It should be understood that the same electrical interconnections may be applied to the circuit patterns 44a, 44b (or portions thereof) of FIGS. 3 and 4b.

As shown in FIG. 5, the circuit pattern 44a on the first side 32 may be formed by blowing open or breaking one or more of the fusible links 38a. The fusible links may be blown or broken in the following manner. First, a high voltage may be applied to one or more of the conductive traces 36a while grounding the common conductive trace 37a. As a result, a large current may pass through one or more of the fusible links 38a connected to the conductive traces 36a that had the voltage applied to them. This large current then blows or breaks the one or more fusible links 38a it passes through, preventing any future current from passing through those one or more fusible links 38a. In other words, the one or more fusible links 38a through which the high current passed will now be part of an open circuit. It should be understood that the fusible links 38a may be blown or broken by the printed circuit board manufacturer or by the printing system that incorporates the printed circuit board, as discussed in more detail below.

In the exemplary embodiment shown in FIG. 5, the plurality of conductive traces 36a are referenced as "Conductive trace A" through "Conductive trace L," and the fusible links 38a directly attached to Conductive trace A, Conductive trace D, and Conductive trace F have been blown or broken (represented by an "X"). As shown in FIG. 5, each conductive trace (Conductive traces A–L) is labeled with a numerical value corresponding to its bit position within the binary number encoded in the circuit pattern 44a. For example, Conductive trace A is assigned a numerical value of "1" (i.e., $2^0$), Conductive trace B is assigned a numerical value of "2" (i.e., $2^1$), Conductive trace C is assigned a numerical value of "4" (i.e., $2^2$), and so on, with the number of possible combinations of encoded numerical values for the circuit pattern being directly proportional to the number of conductive traces 36a (e.g., Conductive traces A–L). In other words, there are $2^N$ possible combinations of encoded numerical values for the circuit pattern, where "N" is the number of conductive traces 36a used to form the circuit pattern. In the exemplary embodiment shown in FIG. 5, there would be "4096" (i.e., $2^{12}$) possible combinations, since there are twelve conductive traces 36a in the circuit pattern 44a.

Depending on which fusible links 38a are blown or broken, the circuit pattern 44a may encode a bit pattern (not shown). This bit pattern comprises a string of logical low and high values. In the exemplary embodiment shown in FIG. 5, the blown or broken (i.e., open circuit) fusible links 38a correspond to logical high values (i.e., a binary "1"), and the non-blown or unbroken (i.e., closed circuit) fusible links 38a correspond to logical low values (i.e., a binary "0"). Thus, if Conductive traces A, D, and F are blown or broken, then the resulting binary number would be "000000101001," which also equates to a numerical value of "41" (i.e., 1+8+32=41). As explained above, this numerical value could be used to represent a media type number 46a or a serial number 46b.

For more information on fusible links and fuse programming, one can refer to U.S. Pat. No. 4,879,587, which is specifically incorporated in its entirety herein by reference.

It should be understood from the preceding discussion that in alternate embodiments, each circuit pattern 44a, 44b may encode more or less data, or different data altogether, and that this description is merely illustrating an exemplary embodiment of this invention. Also, unlike the exemplary embodiment shown in FIG. 4a-4b, in other alternate embodiments, only one side or a portion thereof may have a circuit pattern. Furthermore, in alternate embodiments, it is also possible that both sides or portions thereof may have a substantially similar circuit pattern.

Turning back to FIG. 2 once again, the printed circuit board cover 50 which houses the printed circuit board 30 comprises a first side 54, a second side 56, and a third side 58 all preferably connected together and extending from a base 52. The printed circuit board cover 50 also includes an opening 60 between the first and third sides 54, 58, and a fastener connection area 62 with a pair of connection holes 63. In this exemplary embodiment, when assembled, the base 52, the first side 54, the second side 56, and the third side 58 partially enclose the printed circuit board 30. Also, the connection holes 63 are preferably aligned with the fastener holes 42 of the printed circuit board 30 (or 30'). Therefore, when a pair of fasteners 140 are passed through the connection holes 63 and the fastener holes 42, the fasteners 140 align and connect the printed circuit board cover 50 to the printed circuit board 30 (or 30'). It should be understood that the design shown in FIG. 2 for the printed circuit board cover 50 is merely exemplary, and alternate designs for covers that protect the printed circuit board 30 may be utilized. It should also be understood that while the printed circuit board cover 50 is preferably made from a polymer plastic such as polypropylene, polyurethane, or polyvinyl chloride, other suitable materials may be used for the printed circuit board 50, depending on consumer and/or manufacturing preferences.

As shown in FIG. 2, the media support assembly 70 is preferably (but not necessarily) comprised of a media support 80, a fixed support plate 90, and an adjustable support plate 110. The media support 80 is comprised of an outer surface 82, a first end 84, a second end 86, and a male fastener connection area 88. In this exemplary embodiment, the male fastener connection area 88 is located at the first end 84 of the media support 80, but may be located elsewhere in alternate embodiments, such as between the first end 84 and the second end 86.

Figure 6:
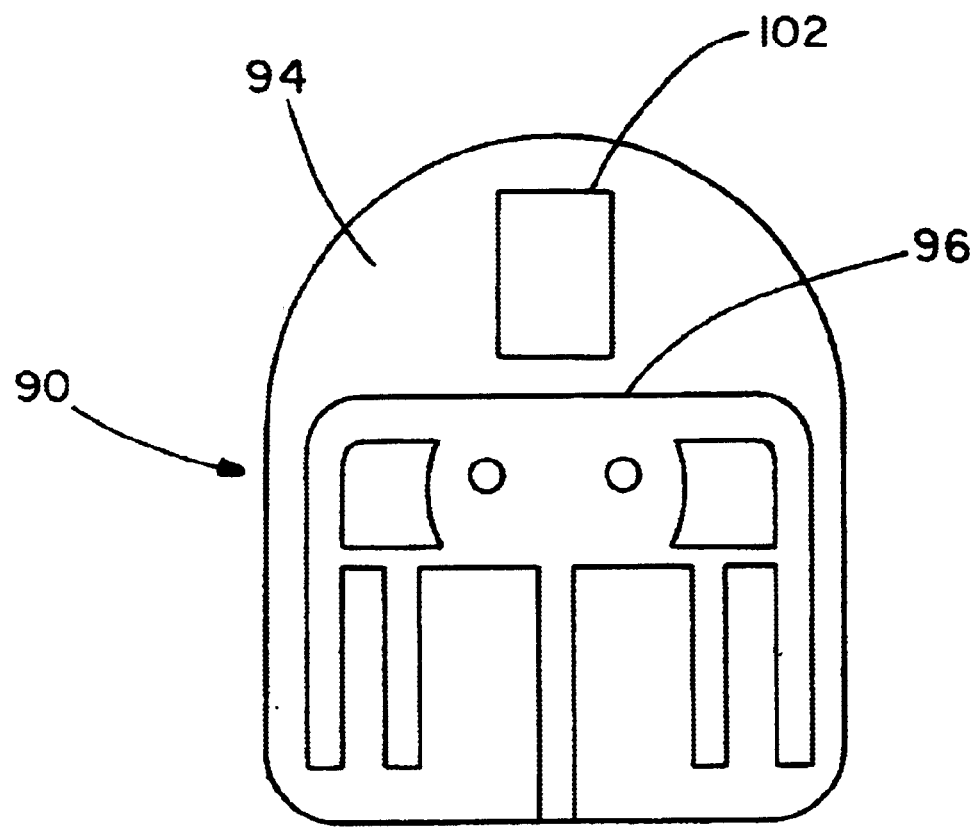
FIG. 6 is a side view of an exemplary embodiment of a fixed support plate for use in the media cartridge of FIG. 2.

As shown in FIGS. 2 and 6, the fixed support plate 90 is preferably comprised of a first side 92, a second side 94, a female fastener connection area 96, and a fingerplate 102 (see FIG. 6). In this exemplary embodiment, the fingerplate 102 is preferably connected to the second side 94 of the fixed support plate 90. The fingerplate 102 provides a convenient place to grasp the fixed support plate 90. The female fastener connection area 96 is present on both the first side 92 and the second side 94 of the fixed support plate 90. As best shown in FIG. 2, the female fastener connection area 96 preferably contains a recessed portion 96a for receiving the male fastener connection area 88 of the media support 80, and a pair of support holes 96b aligned with the fastener holes 42 and the connection holes 63 for receiving the fasteners 140. Consequently, the male fastener connection area 88 may be mated with the recessed portion 96a of the female fastener connection area 96 to connect the media support 80 and the fixed support plate 90, and the fasteners 140 may be passed through the connection, fastener, and support holes 63, 42, 96b to connect the printer circuit board cover 50, the printed circuit board 30, the fixed support plate 90, and the media support 80 together.

The adjustable support plate 110 is comprised of a first side 112, a second side 114, a central bore 116, a central bore inner surface 118, a first finger tab 120, and a second finger tab 122. The first finger tab 120 and the second finger tab 122 are preferably connected to the first side 112 of the adjustable support plate 110. Once again, like the fingerplate 102, the first finger tab 120 and the second finger tab 122 serve as a convenient place to grasp the adjustable support plate 110. The central bore 116 passes through the adjustable support plate 110 from the first side 112 to the second side 114. The central bore inner surface 118 preferably has dimensions corresponding to the outer surface 82 of the media support 80. Hence, in this exemplary embodiment, the central bore inner surface 118 can be removably mounted on the outer surface 82 of the media support 80 near its second end 86 to removably connect the adjustable support plate 110 to the media support 80 (and thus the fixed support plate 90).

In this exemplary embodiment, the material used for all of the components in the media support assembly 70 is preferably a polymer plastic, such as polypropylene, polyurethane, or polyvinyl chloride. Like the printed circuit board cover 50, however, it should be understood that other suitable materials may be used for such components, depending on consumer and/or manufacturing preferences.

As shown in FIG. 2, the media source 130 is preferably comprised of a central bore 132, and a central bore inner surface 134. The central bore inner surface 134 preferably has dimensions larger than the outer surface 82 of the media support 80. Hence, in this exemplary embodiment, the central bore inner surface 134 can be removably mounted on the outer surface 82 of the media support 80.

In the exemplary embodiment shown in FIG. 2, the media source 130 is a roll of labels, but different types of media may be used in alternate embodiments of the present invention. For example, in alternate embodiments, the media source 130 may be a stack of papers or photographs, or a roll of another type of printable media. In such alternate embodiments, especially embodiments involving a stack of media, it should be understood that the media support 80 may be more in the form of a tray for holding and supporting media, as opposed to the rod-like configuration shown in FIG. 2.

FIG. 2 also shows a pair of fasteners 140, more specifically a first fastener 142 and a second fastener 144, which have been referred to above. In one exemplary embodiment, the fasteners may be metal screws. It should be understood, however, that other types of fasteners, such as nails, bolts, rivets, tabs, and snap-fit components, may be used with the media cartridge of the present invention, depending on consumer and/or manufacturing preferences.

Figure 7:
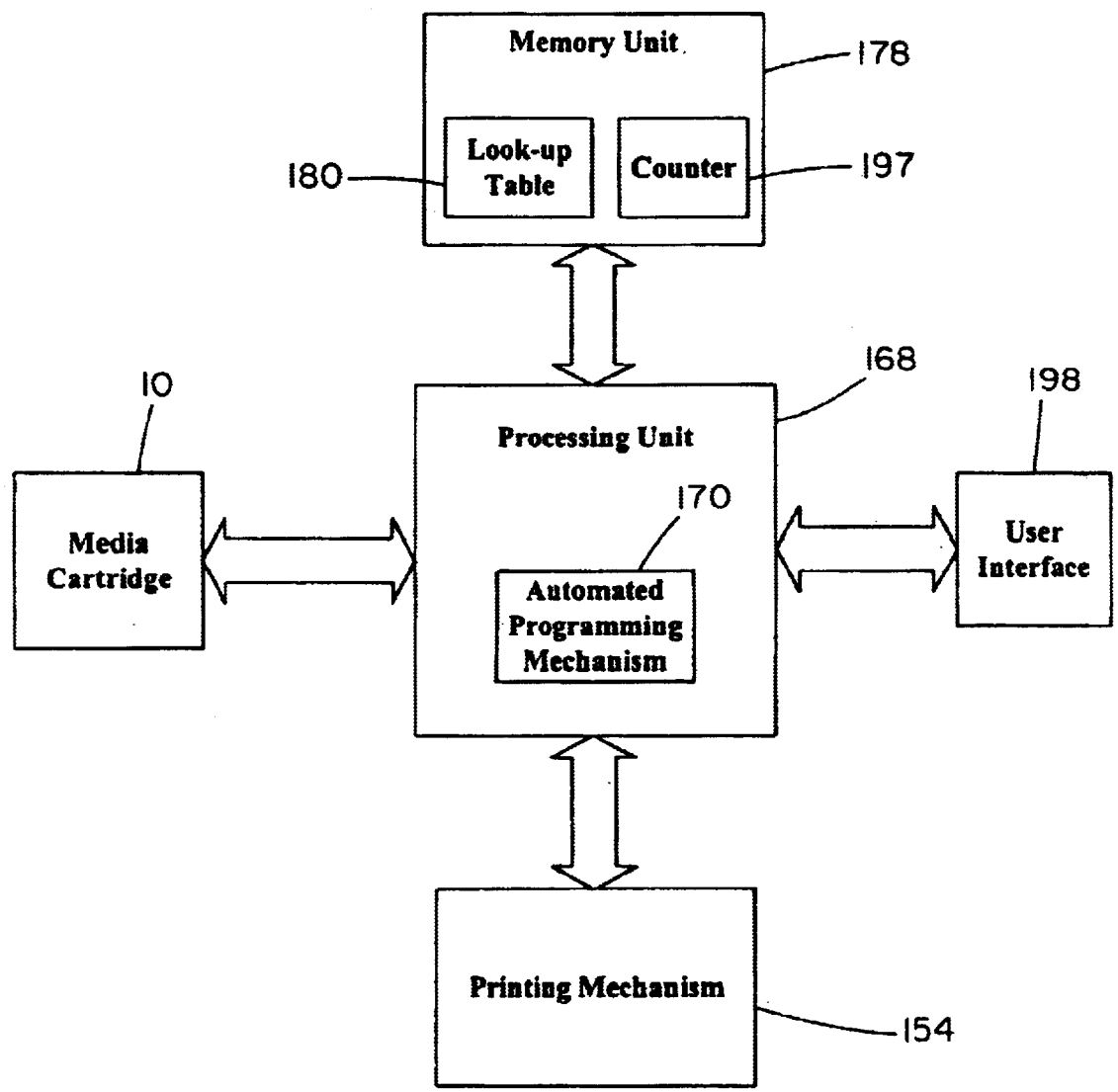
FIG. 7 is a block diagram overview of the operation of the printing system of FIG. 1.

Turning now to FIG. 7, a block diagram of an exemplary printing machine 150 is shown with electronic communications and connections indicated with arrows. The exemplary printing machine 150 comprises a processing unit 168 that is connected to and in communication with a printing mechanism 154, a media cartridge interface 160, a memory unit 178, and a user interface 198. The processing unit 168 is further comprised of an automated programming mechanism 170, and the memory unit 178 is further comprised of a look-up table 180 and a counter 197.

The printing mechanism 154 is the mechanical mechanism by which the printing machine 150 prints. In one exemplary embodiment, the printing mechanism is a thermal printing mechanism. A thermal printing mechanism is generally comprised of a fixed linear array of heating elements designed to make direct contact with thermally sensitive media. It should be understood, however, that alternate embodiments are also possible, and the printing mechanism 154 may, for example, be a dot matrix printing mechanism or a laser printing mechanism. For more information on thermal printing mechanisms and thermal printers, one can refer to U.S. Pat. Nos. 3,965,330 and 3,947,854. U.S. Pat. Nos. 3,965,330 and 3,947,854 are hereby specifically incorporated herein by reference.

Figure 8:
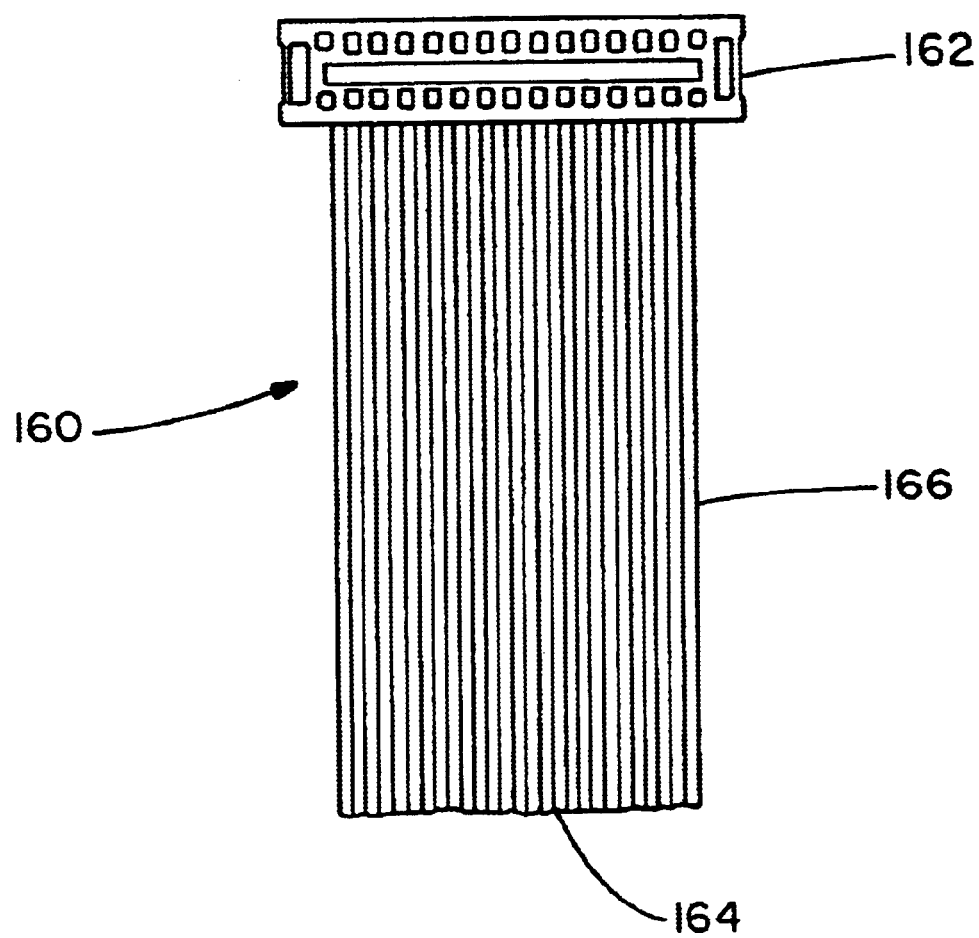
FIG. 8 is a top view of an exemplary embodiment of a media cartridge interface for use in the printing system of FIG. 1.

An exemplary embodiment of the media cartridge interface 160 is shown in FIG. 8. The media cartridge interface 160 is comprised of a first end 162, a second end 164, and a wire band 166 connecting the first and second ends 162, 164. The first end 162 of the media cartridge interface 160 is designed to connect to the connection edge 35 of the printed circuit board 30 through the opening 60 in the printed circuit board cover 50. When the first end 162 of the media cartridge interface 160 is connected to the connection edge 35 of the printed circuit board 30, the media cartridge interface 160 preferably contacts, and is capable of reading the encoding of, the circuit pattern 44a and its plurality of conductive traces 36a.

The second end 164 of the media cartridge interface 160 is designed to connect to the processing unit 168 on the printing machine 160. Therefore, the media cartridge interface 160 connects the printed circuit board 30 to the printing machine 150. While a wire band 166 is shown in the exemplary embodiment of FIG. 8, however, it should be understood that the wire band is not necessary, and the second end 164 of the media cartridge interface may be mounted directly to, and formed integral with, the housing of the printing machine.

In one exemplary embodiment, the media cartridge interface 160 is a simple off-the-shelf card edge connector, but any device known to form an interface with printed circuit boards may be used. For more information on this subject, one can refer to U.S. Pat. Nos. 6,254,435 and 6,174,184, which pertain to card edge connectors. U.S. Pat. Nos. 6,254,435 and 6,174,184 are hereby specifically incorporated in their entirety herein by reference.

In the exemplary embodiment of the printing machine 150 shown in FIG. 7, the processing unit 168 of the printing machine 150 is a microprocessor running a proprietary operating system. Generally, computational processes that take place within the printing machine 150 take place in the processing unit 168. Furthermore, the processing unit 168 connects to and controls the printing mechanism 154, the media cartridge interface 160, the memory unit 178, and the user interface 198. In this exemplary embodiment, the parameters 46 of the printed circuit board 30, such as the media type number 46a and/or the serial number 46b, are received at the printing machine 150 by the processing unit 168 via the media cartridge interface 160. It should be understood that the preceding description of the processing unit is only exemplary, and one of ordinary skill in the art would be able to contemplate other alternate embodiments without departing from the scope and spirit of the present invention.

The processing unit 168 is further comprised of an automated programming mechanism 170, which may be used to fuse program the printed circuit board 30. In this exemplary embodiment, the automated programming mechanism 170 is a device that sends a high current across the media cartridge interface 160 through one of more of the conductive traces 36a and/or the conductive traces 36b in order to blow or break one or more of the fusible links 38a and/or fusible links 38b, respectively. Fusible links 38a and/or fusible links 38b are sized to require a small amount of current to melt or vaporize the link. The method of operation of such a device as the automated programming mechanism 170 has been explained earlier when discussing the printed circuit board 30. For more information on fusible links and fusible link programming devices such as the automated programming mechanism 170, one can refer to U.S. Pat. No. 4,879,587, which has already been incorporated by reference, and U.S. Pat. No. 5,025,300, which is also hereby specifically incorporated in its entirety herein by reference.

FIG. 7 also shows the exemplary memory unit 178. In this exemplary embodiment, the memory unit 178 is preferably a non-volatile memory device such that memory values will not be lost when the printing machine is powered off. Of course, other memory devices known in the art may also be used with the memory unit of the present invention.

Preferably, the memory unit 178 is electronically connected to the processing unit 168, and is also physically contained in the housing 152 of the printing machine 150.

As shown in FIG. 7, a look-up table 180 may be stored in the memory unit 178. Preferably, but not necessarily, the look-up table 180 is a first-in-first-out (FIFO) storage table that is comprised of a set of row entries 182, as shown in FIG. 9. In one exemplary embodiment, there may be anywhere up to thirty row entries 182 in the look-up table 180, but more or less row entries may be used depending on the memory size and consumer and/or manufacturing preferences. As shown in FIG. 9, each row entry in the set of row entries 182 is comprised of one column entry from each of the following column arrays: an index array 184, a media type number array 186, a serial number array 188, a starting media amount array 190, and a remaining media amount array 192. To simplify the analysis of the look-up table 180, one can examine a sample row entry 194 in light of each exemplary column array in closer detail.

The index array 184 keeps track of the number of entries in the look-up table 180. The processing unit 168 is the unit that updates and modifies the index array 184. For sample row entry 194, the corresponding value in the index array 184 is "6." Therefore, in this exemplary embodiment, the sample row entry 194 is the sixth row entry in the set of row entries 182.

Each entry in the media type number array 186 identifies the type of media source 130 present in a media cartridge 10 that has been loaded into the printing machine 150. Thus, each entry in this array is a media type number 46a (or 46a') that was sent from the printed circuit board 30 to the look-up table 180 via the media cartridge interface 160 and the processing unit 168. FIG. 9 shows that the media type number 46a corresponding to the sample row entry 194 is "10." This value of "10" may be used to indicate that the media source 130 of the media cartridge 10 inserted into the printing machine is a roll of 2 inch by 4 inch shipping labels. The processing unit 168 can also utilize the media type number 46a to customize the printing process for the type of media source in the media cartridge.

Each element in the serial number array 188 individually identifies a particular media cartridge 10 to which the printing machine 150 has been connected. Each element in the serial number array 188 is a serial number 46b (or 46b') sent from the printed circuit board 30 to the look-up table 180 via the media cartridge interface 160 and the processing unit 168. FIG. 9 shows that the serial number 46a corresponding to the sample row entry 194 is "3424." This value of "3424" may be used by the printing machine to recall information, such as how much media is left, about a media cartridge that was removed and later reinserted.

The starting media amount array 190 stores the value of the amount of media that is present in an unused, new media cartridge 10. In this exemplary embodiment, this value is already stored within the memory unit 168. However, it is possible in alternate embodiments that this value is obtained in another manner. For example, an entry in the starting media amount array 190 may be obtained from the printed circuit board 30 as a parameter 46a or a parameter 46b. In FIG. 9, the exemplary value in the starting media amount array 190 corresponding to the sample row entry 194 is "100." Thus, a media source of the label roll type "10" may initially include one hundred labels on its roll.

Each entry in the remaining media amount array 192 tracks the amount of media remaining in a specific media cartridge 10. Initially, each element in the remaining media amount array 192 is given the value of the corresponding entry in the starting media amount array 190. Then, as media is printed and used from the media cartridge 10, the value of the entry in the remaining media amount array 192 that corresponds to the media cartridge 10 is decremented. In the exemplary embodiment of the printing machine shown in FIG. 7, this decrementation is achieved by a counter 197. The value of the entry in the remaining media amount array 192 is passed to the counter 197, where it is decremented as media is used, and then passed back to the remaining media amount array 192. As an illustration of this process, FIG. 9 shows the value in the remaining media amount array 192 corresponding to the sample row entry 194 is "15." Hence, this means that eighty-five pieces of media have been printed from media cartridge 10 with the serial number of "3424," since there were originally one-hundred and now there are only fifteen left. If nine more pieces of media are printed from the "3424" media cartridge, the counter 197 would receive the value "15" from the remaining media amount array 192, decrement it by "9," and store back the value "6" in the remaining media amount array 192 entry corresponding to the "3424" media cartridge. Thus, the remaining media amount array 192 holds the correct value of the amount of media remaining on media cartridge 10. It should be understood that the decrementation explained above may be achieved in a variety of ways, such as by having each entry in the remaining media amount array 192 be a counter itself, without departing from the scope and spirit of the present invention.

Returning to FIG. 7, as mentioned above, the printing machine may also include a user interface 198 connected to and in communication with the processing unit 168. In this exemplary embodiment, the user interface 198 is preferably a display, such as a Liquid Crystal Display (LCD), that shows to the user of the printing machine the amount of media remaining in the media cartridge (i.e., the entries from the remaining media amount array 192 of the look-up table 180), the media type number 46a, and/or the serial number 46b, as well as possible error and warning messages. Values for these amounts and numbers may be acquired from the look-up table 180 via the processing unit 168. In alternate embodiments, many other embellishments may be added to the user interface 198, such as creating a user input module that would enable the user to make custom changes to the printing procedure. Thus, it should be understood that a variety of different user interfaces may be used in alternate embodiments of the present invention.

Figure 10:
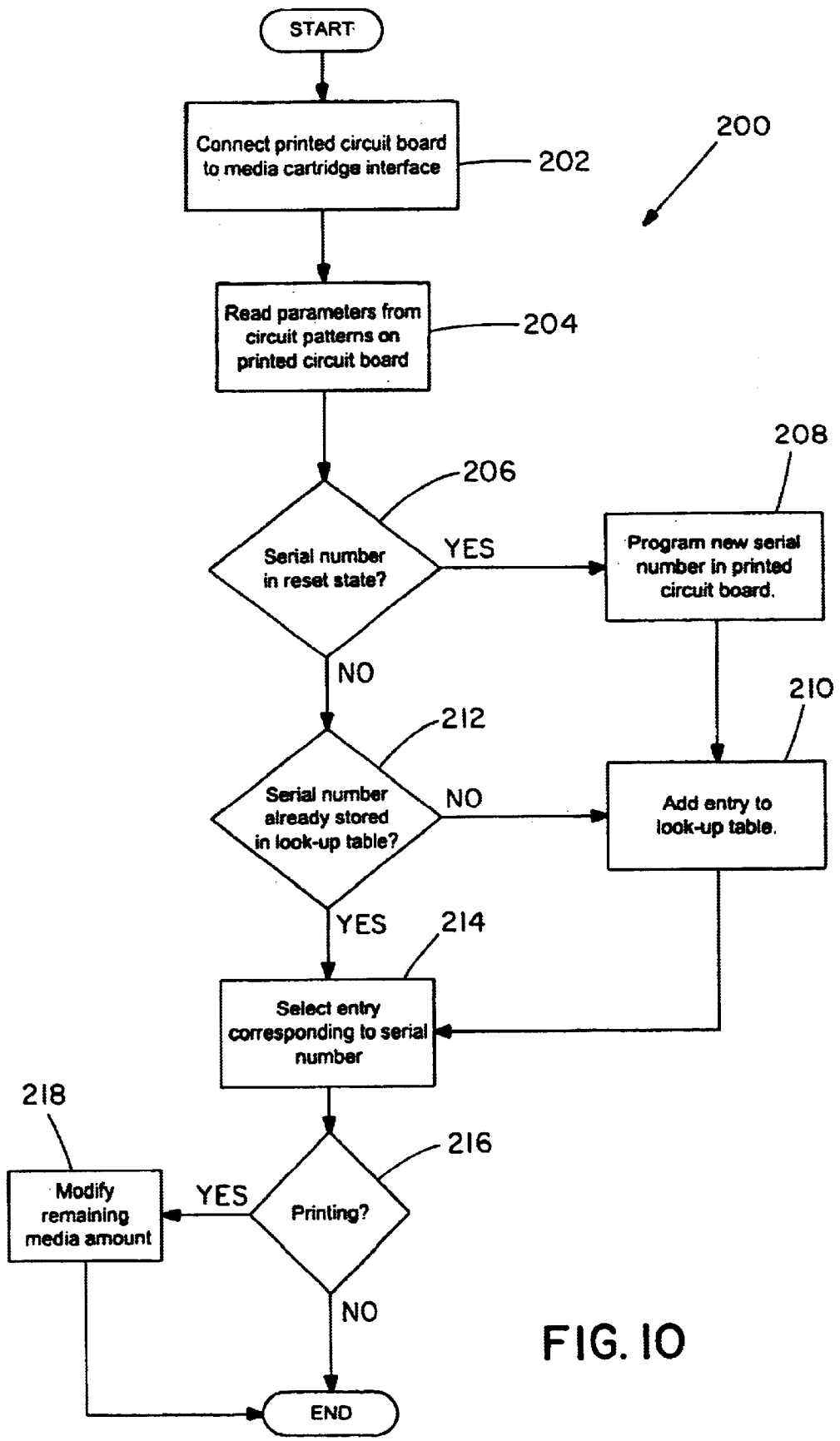
FIG. 10 is a flow chart of an exemplary method of the printing system of FIG. 1.

Having examined the structure and connectivity of the elements of the exemplary printing system, an exemplary method of operation of the printing system will now be described. FIG. 10 is a flowchart diagraming an exemplary method of operation 200 of the exemplary printing system 8. In the first step, step 202, the connection edge 35 of the printed circuit board 30 is connected to the media cartridge interface 160 of the printing machine 150. Next, in step 204, the processing unit 168 of the printing machine 150 reads one or more parameters 46 (e.g., the media type number 46a, 46a' and/or the serial number 46b, 46b') that is encoded by circuit pattern 44a and/or circuit pattern 44b on the printed circuit board 30 (or 30').

In step 206, a determination is preferably made by the processing unit 168 as to whether a parameter, such as the serial number, is in a reset state. A parameter is in a reset state if it has not been previously set or programmed by the manufacturer of the printed circuit board of the media cartridge. If a parameter, such as a serial number, is in the reset state, then in step 208 the parameter (e.g., the serial number) must be programmed into the printed circuit board by the printing machine. This may be accomplished with fuse programming via the automated programming mechanism 170 described above. Once the parameter has been programmed into the printed circuit board, the new parameter (e.g., the serial number) is added as an entry in the appropriate location of the look-up table 180 in step 210.

Returning to the decision of step 206, if there are no parameters in the reset state (i.e., all of the parameters were previously set or programmed by the printed circuit board manufacturer), then the method 200 continues with step 212. As shown in FIG. 10, in step 212, a determination is made as to whether or not the printed circuit board's parameters, such as the printed circuit board's serial number, has already been stored or logged into the look-up table. If the parameters have not yet been entered into the look-up table, then they are added to appropriate entries in the look-up table in step 210 (described above).

As shown in FIG. 10, if the printed circuit board's parameters have already been entered into the look-up table, or they have been added to the look-up table pursuant to step 210, then the method 200 continues with step 214. In step 214, the look-up table entry corresponding to the printed circuit board's parameters is selected for printing with the respective media cartridge. The selected look-up table entry may then be updated as printing proceeds.

Finally, in step 216, the processing unit 168 determines if the printing mechanism 154 is printing. If the printing mechanism 154 is printing, the process goes to step 218, and the entry for the remaining media array 192 corresponding to the attached printed circuit board and the media cartridge is modified and updated by decrementing a counter corresponding to the amount of media that is being printed and used. After the printing has been completed and the look-up table has been updated with the modified remaining media amount (or if there was no printing to begin with), the method 200 ends.

The printing system of the present invention has many advantages over the prior art printing systems. For example, the printing system of the present invention uses media cartridges with printed circuit boards that are inexpensive to manufacture, especially when compared to memory chips and mechanical switches. In addition, not only are these printed circuit boards easy and inexpensive to program with fuse programming, but they are capable of storing relatively large parameter numbers without requiring a large amount of space and components. Moreover, the printed circuit boards of the present invention are reliable and resistant to electrostatic damage, as well as wear and tear, and may be used with standard, off-the-shelf hardware (as opposed to the custom fittings and housings required for mechanical switches). Indeed, the inexpensive, yet large parameter capacity of these printed circuit boards enables the printing system of the present invention to utilize a much more detailed, in-depth, and feature rich look-up table for customizing printing projects and better regulating replacements of media cartridges. Furthermore, the printing machine of the present invention is capable of recognizing a wide variety of different types of media cartridges, as well as recognizing a large number of different media cartridges of the same type (and recalling information about them).

It should be understood that a wide variety of changes and modifications may be made to the embodiments of the printing system described above. For instance, the normal functions and/or determinations handled by the processing unit of the printing machine may be distributed to other intelligent components of the printing machine and off-loaded from the main processor. In addition, certain components, functions, and operations of the printing system of the present invention may be accomplished with hardware, software, and/or a combination of the two. It is therefore intended that the foregoing description illustrates rather than limits this invention, and that it is the following claims, including all equivalents, that define this invention:

We claim:

1. A printing system comprising:

a media cartridge having a printed circuit board including a first side and a second side, the printed circuit board having a plurality of conductive traces with fusible links connected together in a circuit pattern on the first side and the second side of the printed circuit board, wherein the circuit pattern on the first side of the printed circuit board comprises an encoding of a media type number identifying the type of media source for the media cartridge, and the circuit pattern on the second side of the printed circuit board comprises an encoding of a serial number identifying the media cartridge; and a printing machine including a housing, a printing mechanism connected to the housing, a processing unit connected to the housing, and a media cartridge interface having a first end connected to the processing unit and a second end connected electronically to the printed circuit board of the media cartridge.

2. The printing machine of claim 1, wherein the printing machine further comprises an automated programming mechanism in communication with the printed circuit board, the automated programming mechanism producing an electrical current that passes through and breaks at least one of the fusible links on the printed circuit board to create a further circuit pattern on the first side or the second side of the printed circuit board.

3. The printing system of claim 1, wherein the media cartridge further comprises a media support connected to the printed circuit board.

4. The printing system of claim 3, wherein the media cartridge further comprises a media source mounted on the media support.

5. The printing system of claim 4, wherein the media source further comprises a roll of labels.

6. The printing system of claim 1, wherein the printing mechanism composes a thermal printing mechanism.

7. A printing system comprising:

a media cartridge; and a printing machine including a housing, a printing mechanism connected to the housing, a processing unit connected to the housing, a media cartridge interface with a first end connected to the processing unit and a second end connected electronically to the media cartridge, and a look-up table for storing at least one variable parameter associated with the media cartridge, the at least one variable parameter associated with the media cartridge being sent electronically from the media cartridge to the look-up table of the printing machine across the media cartridge interface, wherein the at least one variable parameter associated with the media cartridge comprises an index array identifying the number of entries in the look-up table.

8. The printing system of claim 7, wherein the media cartridge further comprises a printed circuit board connected electronically to the media cartridge interface of the printing machine, the printed circuit board having a plurality of conductive traces with fusible links connected together in a circuit pattern on at least one side of the printed circuit board.

9. The printing machine of claim 8, wherein the printing machine further comprises an automated programming mechanism in communication with the printed circuit board the automated programming mechanism producing an electrical current that passes through and breaks at least one of the fusible links on the printed circuit board to create a further circuit pattern on the at least one side of the printed circuit board.

10. The printing system of claim 8, wherein the circuit pattern on the printed circuit board comprises an encoding of the at least one variable parameter associated with the media cartridge.

11. The printing system of claim 7, wherein the media cartridge further comprises a media support connected to the printed circuit board.

12. The printing system of claim 11, wherein the media cartridge further comprises a media source mounted on the media support.

13. The printing system of claim 12, wherein the media source further comprises a roll of labels.

14. The printing system of claim 7, wherein the at least one variable parameter associated with the media cartridge comprises a remaining media amount array identifying the amount of media remaining in a specific media cartridge.

15. The printing system of claim 7, wherein the printing mechanism comprises a thermal printing mechanism.

* * * * *